United States Patent
Watanabe et al.

(10) Patent No.: US 8,130,503 B2
(45) Date of Patent: Mar. 6, 2012

(54) MOUNTING STRUCTURE OF SEMICONDUCTOR DEVICE AND ELECTRONIC APPARATUS USING THEREOF

(75) Inventors: Shinji Watanabe, Minato-ku (JP); Takao Yamazaki, Minato-ku (JP)

(73) Assignee: NEC Corporation, Tokyo (JP)

( * ) Notice: Subject to any disclaimer, the term of this patent is extended or adjusted under 35 U.S.C. 154(b) by 398 days.

(21) Appl. No.: 12/411,884

(22) Filed: Mar. 26, 2009

(65) Prior Publication Data

US 2009/0244860 A1 Oct. 1, 2009

(30) Foreign Application Priority Data

Mar. 26, 2008 (JP) .................................. 2008-080372

(51) Int. Cl.
*H05K 1/00* (2006.01)

(52) U.S. Cl. ........ 361/749; 361/742; 361/758; 361/760; 174/525; 174/255

(58) Field of Classification Search .................. 174/250, 174/254, 255, 260, 261, 525, 527, 521; 361/748, 361/749, 728, 742, 758, 760, 761, 770, 751, 361/752, 736, 804; 257/685, 686, 688, 692, 257/693, 696, 723, E23.06, E23.063, E23.177; 439/278, 279
See application file for complete search history.

(56) References Cited

U.S. PATENT DOCUMENTS

| | | | |
|---|---|---|---|
| 5,895,970 A * | 4/1999 | Miyoshi | 257/696 |
| 6,165,817 A * | 12/2000 | Akram et al. | 438/118 |
| 6,294,831 B1 | 9/2001 | Shishido et al. | |
| 6,576,992 B1 * | 6/2003 | Cady et al. | 257/686 |
| 6,611,434 B1 * | 8/2003 | Lo et al. | 361/760 |
| 6,646,335 B2 * | 11/2003 | Emoto | 257/686 |
| 6,998,704 B2 | 2/2006 | Yamazaki et al. | |
| 2001/0040793 A1 * | 11/2001 | Inaba | 361/749 |
| 2003/0021096 A1 * | 1/2003 | Vinson et al. | 361/782 |
| 2003/0179556 A1 * | 9/2003 | Zhao et al. | 361/760 |
| 2006/0092614 A1 * | 5/2006 | Partridge et al. | 361/767 |
| 2006/0255446 A1 * | 11/2006 | Wehrly, Jr. | 257/688 |

FOREIGN PATENT DOCUMENTS

| | | |
|---|---|---|
| JP | 6120285 A | 4/1994 |
| JP | 8335663 A | 12/1996 |
| JP | 3395164 B2 | 2/2003 |
| JP | 2004-146751 A | 5/2004 |

OTHER PUBLICATIONS

Notice of Grounds for Rejection issued Nov. 15, 2011 by the Japanese Patent Office in counterpart Japanese Patent Application No. 2008-080372.

* cited by examiner

*Primary Examiner* — Hoa C Nguyen
(74) *Attorney, Agent, or Firm* — Sughrue Mion, PLLC (57) ABSTRACT

A mounting structure comprises at least one semiconductor device having solder bumps on a lower surface thereof as outer terminals and a flexible wiring board with wiring formed thereon. The semiconductor device is wrapped in a flexible wiring board; the mounting structure is provided with outer electrodes on both of a side on which the outer terminals of the semiconductor device are formed and an opposite side thereto; at least one wiring layer is formed on the flexible wiring board; and a supporting member is affixed between a lower surface of the semiconductor device on which the outer terminals are formed and the flexible wiring board.

19 Claims, 9 Drawing Sheets

MOUNTING STRUCTURE OF SEMICONDUCTOR DEVICE AND ELECTRONIC APPARATUS USING THEREOF

REFERENCE TO RELATED APPLICATION

This application is based upon and claims the benefit of the priority of Japanese patent application No. 2008-080372, filed on Mar. 26, 2008, the disclosure of which is incorporated herein in its entirety by reference thereto.

FIELD OF THE INVENTION

This invention relates to a mounting structure of a semiconductor device and particularly relates to a three-dimensional mounting structure formed by laminating a plurality of mounting structures of semiconductor devices. It also relates to an electronic apparatus using the mounting structure.

BACKGROUND

Figure 7:
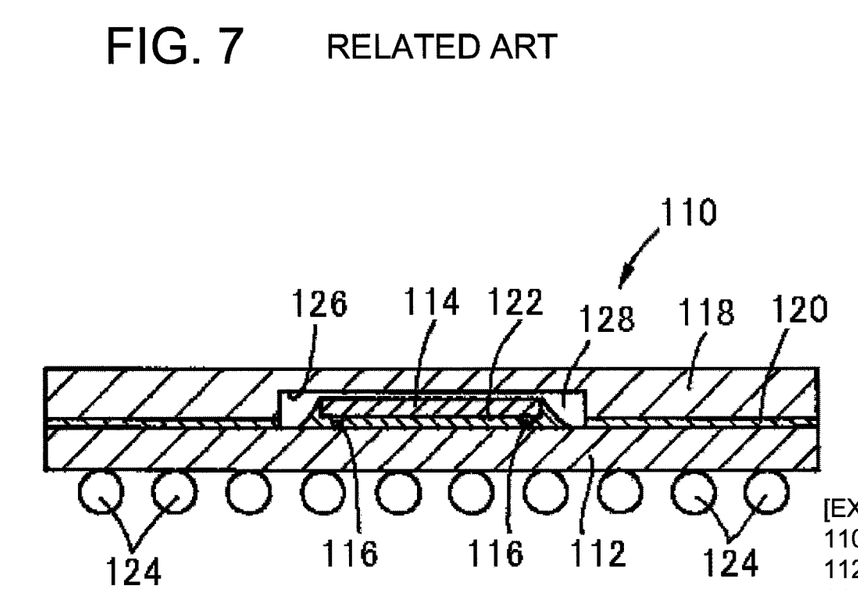
FIG. 7 shows a schematic sectional view of a first exemplary embodiment of a semiconductor device of prior art.

Increase of a number of components due to advanced functions of electronic apparatus and development of miniaturizing or slimming of the apparatus also require miniaturizing or slimming of semiconductor packages themselves. As a semiconductor package suitable for mobile apparatus which are required to be downsized there is a BGA (Ball Grid Array) or CSP (Chip Size Package) as disclosed in Patent Document 1, for example. As shown in FIG. 7 (symbols in FIG. 7 are explained in the figure, added by 100) solder balls are arranged in a grid pattern at the bottom of the package as terminals and this kind of semiconductor package is widely utilized because more terminals can be provided in a narrow area.

Recently a chip-stack type semiconductor package, that is, a plurality of semiconductor chips are stacked in the semiconductor package, is being utilized and particularly plays an important role for mobile apparatuses.

One problem is a high cost of the semiconductor package stacking a plurality of semiconductor chips in the package because a yield after packaging step becomes extremely low when the stacked semiconductor chips are not well inspected or when semiconductor chips which may cause low yields are combined.

Particularly, when using semiconductor chips purchased from other companies further own inspections are necessary to guarantee the quality of the semiconductor chips because the quality of the semiconductor chips themselves cannot be guaranteed to the same extent of the semiconductor packages. Therefore, provision for inspection devices and inspection programs are necessary, which results in higher manufacturing costs.

Figure 8:
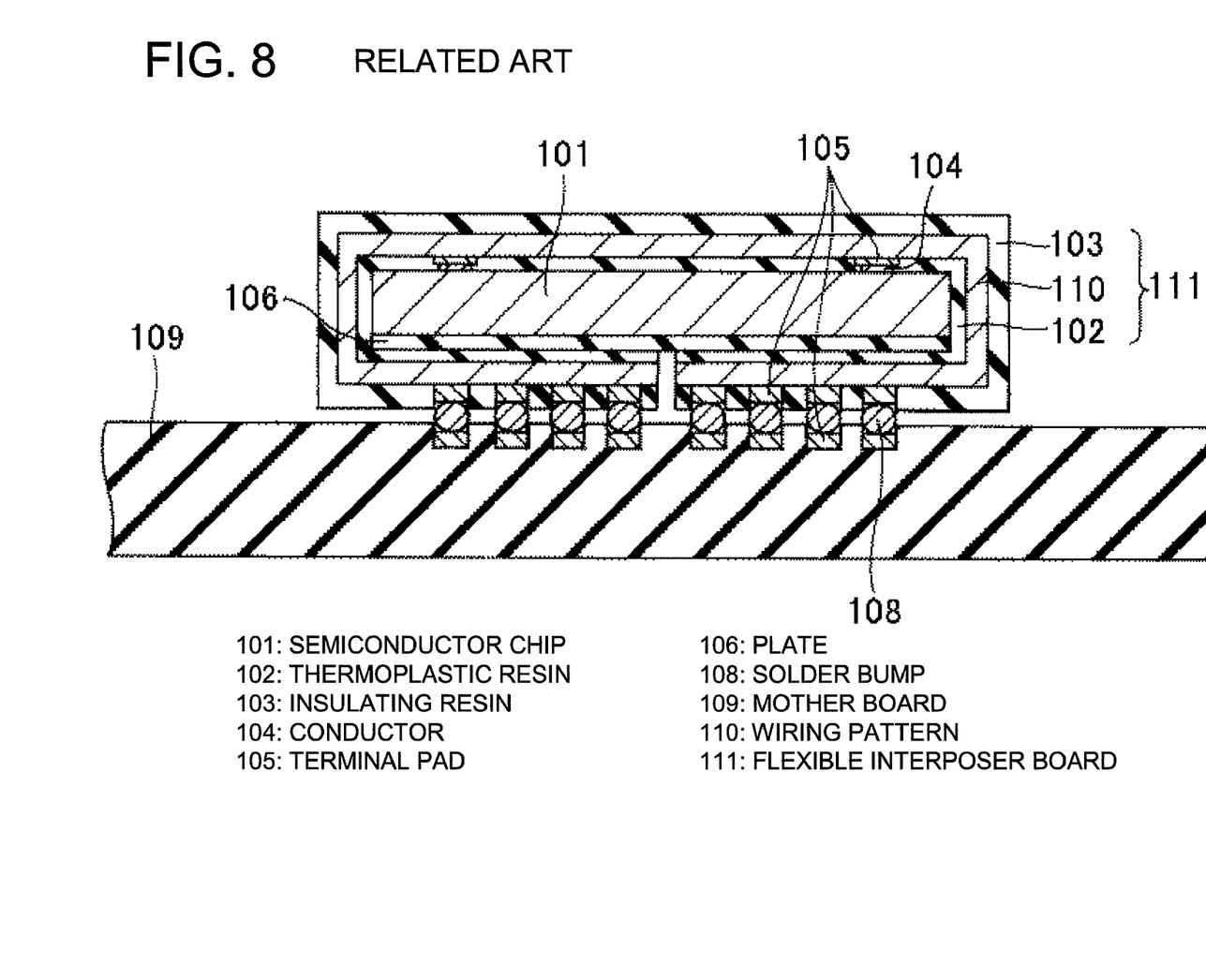
FIG. 8 shows a schematic sectional view of a second exemplary embodiment of a semiconductor device of prior art.

Thus the applicant proposed a semiconductor package structure of stack-packaged type as shown in FIG. 8 (symbols in FIG. 8 are explained in the figure, added by 100) (Patent Document 2). To manufacture the semiconductor package structure a plurality of semiconductor chips are packaged, then these packages are inspected separately and finally the packages are stacked to form a semiconductor package structure.
[Patent Document 1] JP-Patent No. 3395164
[Patent Document 2] JP Patent Kokai Publication No. JP-P2004-146751A

SUMMARY

The entire disclosures of Patent Documents 1 and 2 are incorporated herein by reference thereto. The following analyses are given by the present invention.

However, the problem that the equal quality assurance cannot be obtained remained when semiconductor chips were purchased from other companies unsolved and thus the problems of availability of semiconductor chips and high costs were not solved.

Therefore, it can be conceivable to restructure standard semiconductor devices and/or semiconductor packages available in market the quality of which is assured and as a "package which can be stacked each other (mounting structure)" instead of structuring high cost semiconductor chips into a package which can be stacked as it is. However, according to the inventors knowledge, there was a difficulty to keep good coplanarity of solder balls when solder balls are used as terminals of a semiconductor device, which is counted as a drawback in the art.

As one solution of this problem, the applicants proposed a semiconductor device having a flexible wiring board folded at an outer area of the most outwardly arranged solder balls in a related application (JP Patent Application No. 2007-242396, filed on Sep. 19, 2007).

According to a first aspect of the present invention, there is provided a mounting structure comprising at least one semiconductor device having solder bumps on a lower surface of the semiconductor device as outer terminals and a flexible wiring board with wiring formed on the flexible wiring board. The semiconductor device is wrapped in a flexible wiring board. The mounting structure is provided with outer electrodes on both of a side on which the outer terminals of the semiconductor device are formed and an opposite side thereto. At least one wiring layer is formed on the flexible wiring board. A supporting member is affixed between a lower surface of the semiconductor device on which the outer terminals are formed and the flexible wiring board.

According to a second aspect of the present invention, there is provided a stacked-type semiconductor device comprising the mounting structure explained above.

Preferably a passive component is further mounted on the stacked-type semiconductor device.

According to a third aspect of the present invention, there is provided an electronic apparatus comprising the stacked-type semiconductor device explained above.

The meritorious effects of the present invention are summarized as follows. The present invention provides mounting structures of semiconductor devices having a good coplanarity and high yield, mounting structures of semiconductors of stack-packaged type of low costs and electronic apparatuses of high performance, reduced in size and costs.

PREFERRED MODES

A problem that the inventors have found is explained before describing a mounting structure of semiconductor device according to the present invention. When restructuring standard semiconductor devices and/or semiconductor packages the quality of which is assured and available in market into "packages which can be stacked each other (mounting structure)", a situation occurs on the mounting structure as illustrated in FIGS. 9A to 9D.

Figure 9A:
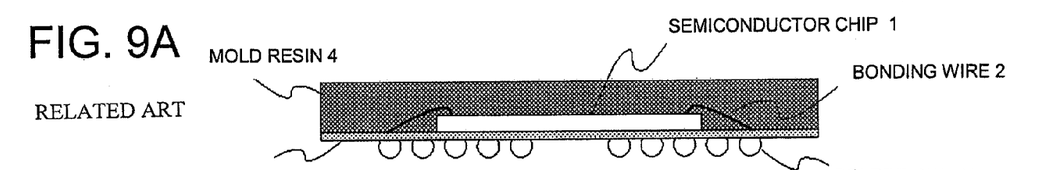
FIGS. 9A to 9D show schematic sectional views and a manufacturing method of a semiconductor device according to a related art in a case of without using the structure according to the present invention.

FIG. 9A is a sectional view of a standard CSP package (semiconductor device) having solder bumps as outer terminals which are suitable for high density mounting. A semiconductor chip 1 is mounted on a wiring substrate 3 and electrodes of the semiconductor chip 1 and wiring patterns of the wiring substrate 3 are electrically connected by bonding wires 2 using a wire bonding method. The substrate 3, the semiconductor chip 1 and the bonding wire 2 are covered and sealed by a molding resin 4. Solder bumps 5 as outer terminals to connect with a wiring substrate for mounting a semiconductor package are formed on a reverse side of the wiring substrate 3 mounted with the semiconductor chip 1.

Figure 9B:
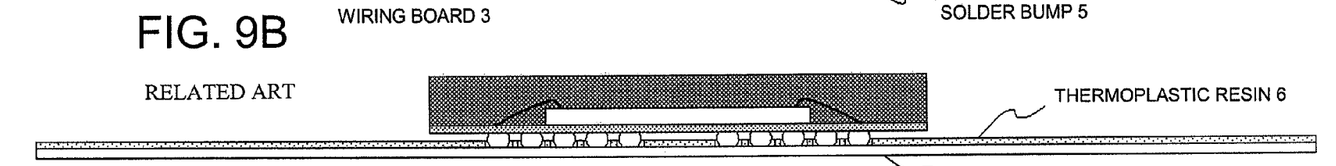
Figure 9C:
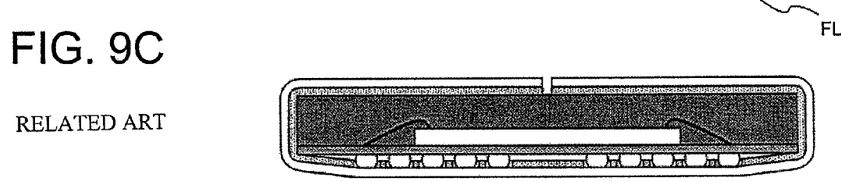
Figure 9D:
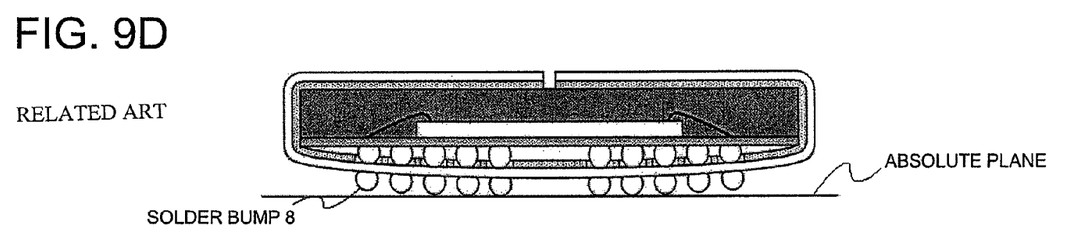

FIGS. 9B to 9D illustrate schematic sectional views and manufacturing steps of a package-stackable semiconductor device (mounting structure). Referring to 9B-9D, the standard package (semiconductor device) having solder bumps 5 as outer terminals is restructured by being covered with folded flexible wiring board 7 having a wiring pattern to electrically connect lower electrodes and upper electrodes of the semiconductor device and thus it becomes possible to stack the package-stackable semiconductors in three dimensions.

FIG. 9B is a sectional view after mounting the semiconductor device on the flexible wiring board 7 having a wiring pattern using a standard method such as a reflow method. A thermoplastic resin 6 is formed on the surface of the flexible wiring board 7 on which the semiconductor device is mounted to adhere the flexible wiring board on the semiconductor device.

FIG. 9C is a sectional view of the restructured semiconductor device which is covered and adhered by the folded flexible wiring board 7. The height of the solder bumps 5 are kept at the original height when the semiconductor device is mounted on the flexible wiring board 7 because the solder bumps are in a solid state at a room temperature. On the other hand a tension in lateral direction remains in the flexible wiring board 7 at the connecting points to the solder bumps 5 caused by enfolding the semiconductor device.

FIG. 9D is a sectional view of the restructured semiconductor device on which solder bumps 8 for connecting with another wiring substrate are mounted using a reflow method. The semiconductor device as a whole is heated up to a temperature higher than the melting point of the solder when the solder bumps 8 are formed and therefore the solder bumps 5 are also molten and the tension stress remained in the flexible wiring board 7 is released. As a result the flexible wiring board 7 becomes bent or wrapped and the curved shape is held after the solder bumps 5 became solid. Thus it becomes difficult to bring all of the solder bumps 8 into contact with one plane (absolute plane).

It will be possible to form the solder bumps 8 by local heating to avoid the melting of the solder bumps 5. However, because the restructured semiconductor device is heated up to more than the melting point of the solder for mounting the semiconductor device on another implemented substrate using a reflow method, the solder bumps 5 will melt and the flexible wiring board 7 will be finally curved.

The most significant problem when mounting the semiconductor device on another wiring substrate is a poor coplanarity of the solder bumps 8 due to the bending (curving) of the flexible wiring board 7. In general, it is known that a defective soldering will occur when a coplanarity of solder bumps exceeds 0.08 mm and therefore a standard of the coplanarity of solder bumps of a semiconductor device is 0.08 mm or less. However, it is very difficult to keep the coplanarity 0.08 mm or less in the case when the flexible wiring board 7 of the semiconductor device inevitably bends as described above.

In the first aspect aforementioned, there are various modes available.

Preferably at least a part of a surface of the semiconductor device opposite to the side on which the outer terminals are formed is adhered to the flexible wiring board.

Preferably at least a part of a side face of the semiconductor device is adhered to the flexible wiring board.

Preferably dimensions of outer shape of the supporting member are equal to or less than outer dimensions of the semiconductor device, and at least a portion where the outer terminals of the semiconductor device are present is cut out to provide a through hole so as not to contact the outer terminals.

Preferably the supporting member is provided at least a part of a peripheral area of the surface of the semiconductor device on which the outer terminals are formed. That is, the supporting member may be divided into several pieces to be arranged in a divided fashion so as to keep the height of the solder bumps within a determined range. The "peripheral area" of the surface on which the outer terminals are formed means an area externally of the area where the outermost peripheral terminals are formed.

Preferably a thickness of the supporting member corresponds to a height of the solder bump when the solder bump is fusedly attached on the flexible wiring board by a reflow method without using the supporting member. Or the thickness may be a height attained subtracting by a thickness of an adhesive layer from the solder bump height or larger than this height. in the case of presence of the adhesive layer. Due to the structure the supporting member will not exert any unnecessary load onto the solder bumps and it makes possible to keep the height of the solder bumps within a constant range when the solder bumps are connected by a reflow method.

Preferably the supporting member is provided with a rising portion standing up vertically between a side face of the semiconductor device and the flexible wiring board from at least a part of an outer edge of the supporting member. The "outer edge of the supporting member" means the outermost area of the supporting member.

Preferably both of at least a part of the side face of the semiconductor device and at least a part of the lower surface of the semiconductor device are fixed in contact with the supporting member.

Preferably both of at least a part of the side face of the semiconductor device and at least a part of the lower surface of the semiconductor device are adhered to the supporting member via an adhesive material.

Preferably at least a part of the rising portion of the supporting member is adhered to the flexible wiring board.

Preferably a thermal expansion coefficient of the supporting member is the same or less than that of the flexible wiring board.

Preferably the supporting member is adhered by an adhesive to at least one of the flexible wiring board and the semiconductor device.

The adhesive may be a conductive adhesive.

Preferably the supporting member is formed by a conductive material and the supporting member and a ground pattern formed on the flexible wiring board are electrically connected via a conductive bump.

Preferably the outermost corner portion of the supporting member corresponding to a position where the flexible wiring board is bent is chamfered in an arc shape or C-shape.

Preferably at least one adhesive layer is formed on a surface of the flexible wiring board, and the semiconductor device and at least a part of the flexible wiring board are adhered each other by the adhesive layer.

The adhesive layer may be made of a thermoplastic resin.

The adhesive layer may be made of a thermosetting resin in a state before setting (termed "pre-setting thermosetting resin).

Some exemplary embodiments according to the present invention are explained with reference to the drawings.

Exemplary Embodiment 1

Figure 1A:
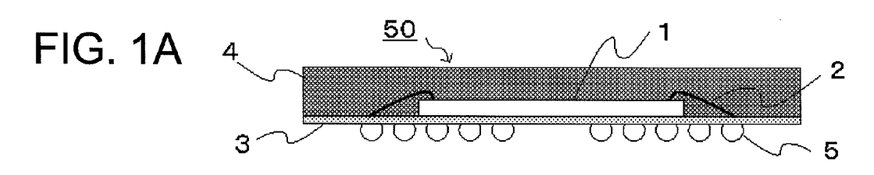
FIGS. 1A to 1E show schematic sectional views and manufacturing method of a mounting structure according to a first exemplary embodiment of the present invention.

FIGS. 1A to 1E show schematic sectional views of a first basic exemplary embodiment of a mounting structure according to the present invention and manufacturing method thereof. FIG. 1A is a sectional view of a standard CSP package (semiconductor device) 50 having solder bumps 5 as outer terminals which are suitable for high density mounting. A semiconductor chip 1 is mounted on a wiring substrate 3 and electrodes of the semiconductor chip 1 and wiring patterns of the wiring substrate 3 are electrically connected by bonding wires 2 using a wire bonding method. The substrate 3, the semiconductor chip 1 and the bonding wires 2 are covered and sealed by a molding resin 4. Solder bumps 5 as outer terminals to connect with a wiring substrate for mounting the semiconductor device 50 are formed on a reverse side of the substrate 3 mounted with the semiconductor chip 1.

Although the semiconductor device 50 manufactured by a wire bonding method is assumed in this exemplary embodiment, the present invention is not limited to the semiconductor device manufactured by the wire bonding method. A semiconductor package manufactured by a flip chip method can be also available as far as solder bumps are formed at a lower surface of the semiconductor package.

Figure 1B:
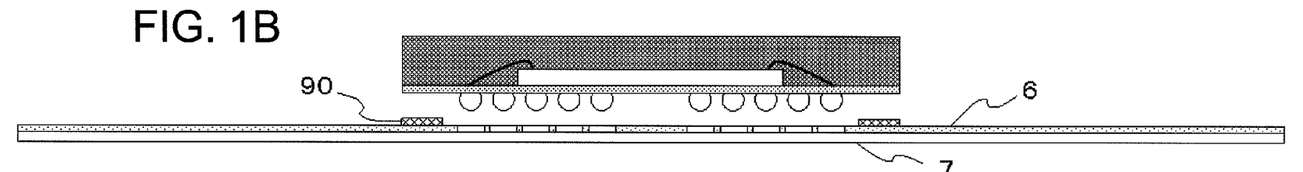
Figure 1C:
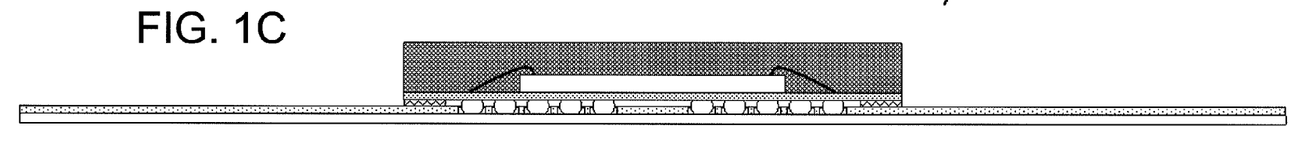
Figure 1D:
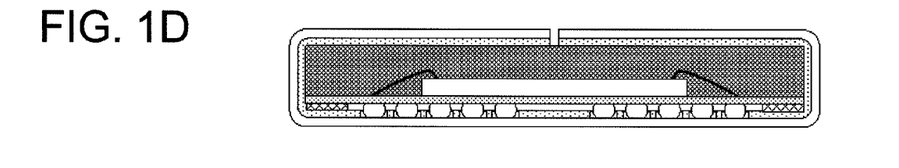

FIGS. 1B to 1E illustrate schematic sectional views and manufacturing steps of an example of a package-stackable mounting structure 60 of the semiconductor device 50. Referring to FIGS. 1B to 1D, the standard packaged-type semiconductor device 50 having the solder bumps 5 as outer terminals is restructured by being covered with folded flexible wiring board 7 having a wiring pattern to electrically connect lower electrodes and upper electrodes of the semiconductor device 50 and thus it becomes possible to stack the package-stackable semiconductors 60 in three dimensions.

FIG. 1B shows a schematic sectional view indicating supporting member(s) 90 affixed to a thermoplastic resin 6 formed as an adhesive layer on the flexible wiring board 7 having a wiring pattern. The position of the supporting member(s) is in a peripheral area of the lower surface (the surface outer terminals are formed) of the semiconductor device 50. The "peripheral area" means an area externally of an area where the outermost peripheral terminals are formed. The supporting member(s) 90 is affixed on the flexible wiring board 7 via the thermoplastic resin 6 by heating the thermoplastic resin 6 to make it sticky.

FIG. 1C is a schematic sectional view of a mounted state of the semiconductor device 50 on the flexible wiring board 7 shown in FIG. 1B. A height of the supporting member(s) 90 provided at parts between the semiconductor device 50 and the flexible wiring board 7 is to be equal to a height of the solder bumps 5 or less so that the solder bumps are molten and connected to the flexible wiring board 7.

More preferably the thickness (height) of the supporting member(s) corresponds to a length from the surface of the semiconductor 50 on which the solder bumps 5 are formed to the surface of the thermoplastic resin 6 when the solder balls are molten and connected to the flexible wiring board 7 by a reflow method without the supporting member(s) 90.

Dimensions of outer shape (length, width) of the supporting member 90 are equal to those of the semiconductor device 50 or less, or at least a part where the outer terminals are present is cut out to provide a through hole so as not to contact the outer terminals. The supporting member(s) may be provided only a part of the corner portion and/or side portion of the peripheral area of the surface of the semiconductor device 50 where the outer terminals are formed. That is, the supporting member may be separated into several parts to be arranged in a divided fashion, to keep the heights of the solder bumps in a determined range.

The heights of the solder bumps 5 become smaller when the solder bumps melt by a reflow step than before melting because the solders are spread on the electrodes of the flexible wiring board 7. However, the height of the supporting member 90 is designed so as to fit between the thermoplastic resin 6 and the semiconductor device 50. It will reduce a dispersion (fluctuation) of the heights of the solder bumps caused by a decrease of the solders, and also it contributes to reduce the dispersion (fluctuation) of the positions of electrodes formed on the flexible wiring board 7 on the upper side of the semiconductor device 50.

Various kinds of materials including inorganic materials and organic materials may be available for the supporting member 90. However, in the case where the supporting member 90 has a ring shape provided along the peripheral area of the semiconductor device 50, the supporting member 90 preferably has a thermal expansion coefficient similar to that of the semiconductor device 50, other wiring substrates on which the restructured semiconductor device (mounting structure) is mounted or the flexible wiring board 7. Such formation is preferred in order to keep a reliability of the connecting portions of the solder bumps against expansion-contraction cycles due to environmental temperature changes after mounting.

A glass-epoxy as an organic material or an aluminum, cupper or stainless steel as an inorganic material may be preferably used for the supporting member 90 because all of the thermal expansion coefficients of those materials are in the range from 10 ppm/degree C. to 30 ppm/degree C.

Although one semiconductor device 50 is mounted on the flexible wiring board 7 in exemplary embodiment 1, a plurality of semiconductor devices 50 and/or other electronic devices may be mounted on the flexible wiring board 7.

FIG. 1D is a sectional view of a mounting structure 60 whose flexible semiconductor device 50 is folded (or wrapped) and adhered from the state shown in FIG. 1C. The semiconductor device 50 and the flexible wiring board 7 are fixed each other via the thermoplastic resin 6 by heating the thermoplastic resin 6 and making it sticky.

Figure 2:
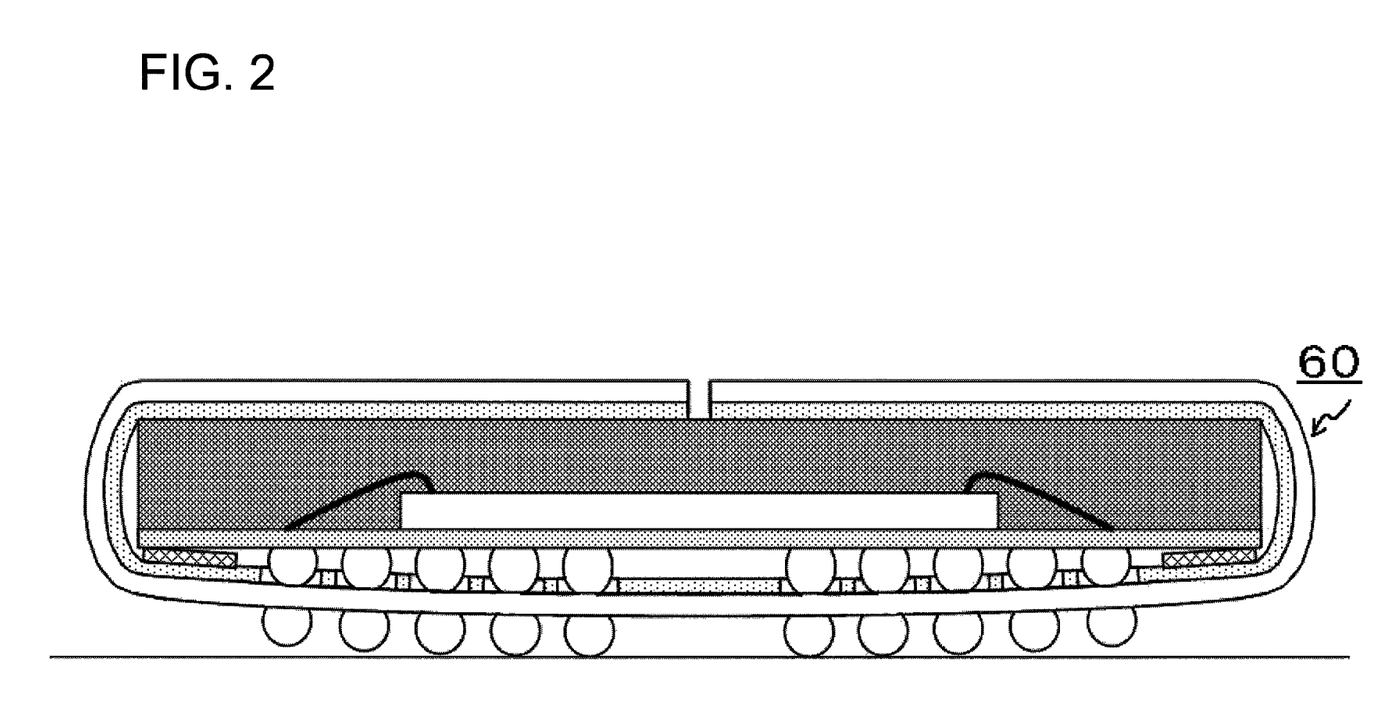
FIG. 2 shows a schematic sectional view of a mounting structure whose flexible wiring board is not adhered to the side face of the semiconductor device.

Preferably the side face of the semiconductor device 50 is adhered to the flexible wiring board 7. FIG. 2 shows a schematic sectional view of a mounting structure 60 when the side face of the semiconductor device 50 and the flexible wiring board 7 are not adhered and heat loaded at a reflow step. The wiring substrate 3 of the semiconductor device 50 is generally made of a glass epoxy substrate and a thermal expansion coefficient of the glass epoxy substrate ranges from 10 to 15 ppm/degree C. at a room temperature to a reflow temperature. On the other hand a thermal expansion coefficient of the flexible wiring board 7 is about 20 ppm/degree C. and therefore, the flexible wiring board 7 expands and becomes loose when heated up during the reflow step as shown in FIG. 2. In addition, the side portion of the flexible wiring board 7 also expands and the slacking of the flexible wiring board 7 becomes worse, resulting in a poor coplanarity of the solder bumps 5.

According to this structure of the present invention, the side portion (side face) of the semiconductor device 50 and the flexible wiring board 7 are adhered and therefore at least an influence of an expansion of the flexible wiring board 7 corresponding to the side portion of the semiconductor device 50 will be minimized. Preferably a material having a thermal expansion coefficient equal to that of the flexible wiring board 7 or larger may be used for the supporting member 90 to restrict a slacking caused by an expansion of the flexible wiring board 7 corresponding to the lower surface of the semiconductor device 50. A tension due to the supporting member 90 occurs in the flexible wiring board 7 during a heat load and it suppresses getting worse of the coplanarity. It is preferable to adhere at least a part of the side face of the semiconductor device 50 to the flexible wiring board 7 even when it is difficult to adhere the whole area of the side face of the semiconductor device 50 due to a roughness of the side face.

Although the supporting member 90 is adhered on the flexible wiring board 7 in exemplary embodiment 1, the supporting member 90 may be adhered to the semiconductor device 50 or to both of the flexible wiring board 7 and the semiconductor device 50.

Figure 1E:
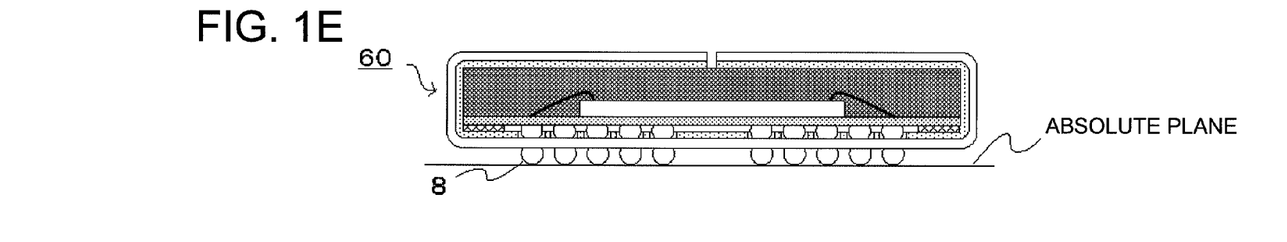

FIG. 1E shows a schematic sectional view in which solder bumps 8 to connect to other wiring substrate are formed by a reflow soldering. The side face of the semiconductor device 50 and the flexible wiring board 7 are adhered and the supporting member(s) 90 is provided between the lower surface of the semiconductor device 50 and the flexible wiring board 7 as explained above. Thus a mounting structure 60 having a good coplanarity at and after heat load of the reflow step and therefore being suitable for package-stacked structure is provided.

An underfill resin may be filled between the lower surface of the semiconductor device 50 and the flexible wiring board 7 (not shown). Then reliability of the connecting portions against a thermal load (or impact) due to a temperature cycle such as a heat at a startup or changes of environmental temperature and/or a physical impact such as a shock of falling will be improved.

Next, exemplary embodiments of package-stacked mounting structures according to the present invention will be explained with reference to FIGS. 3 and 4.

Exemplary Embodiment 2

Figure 3:
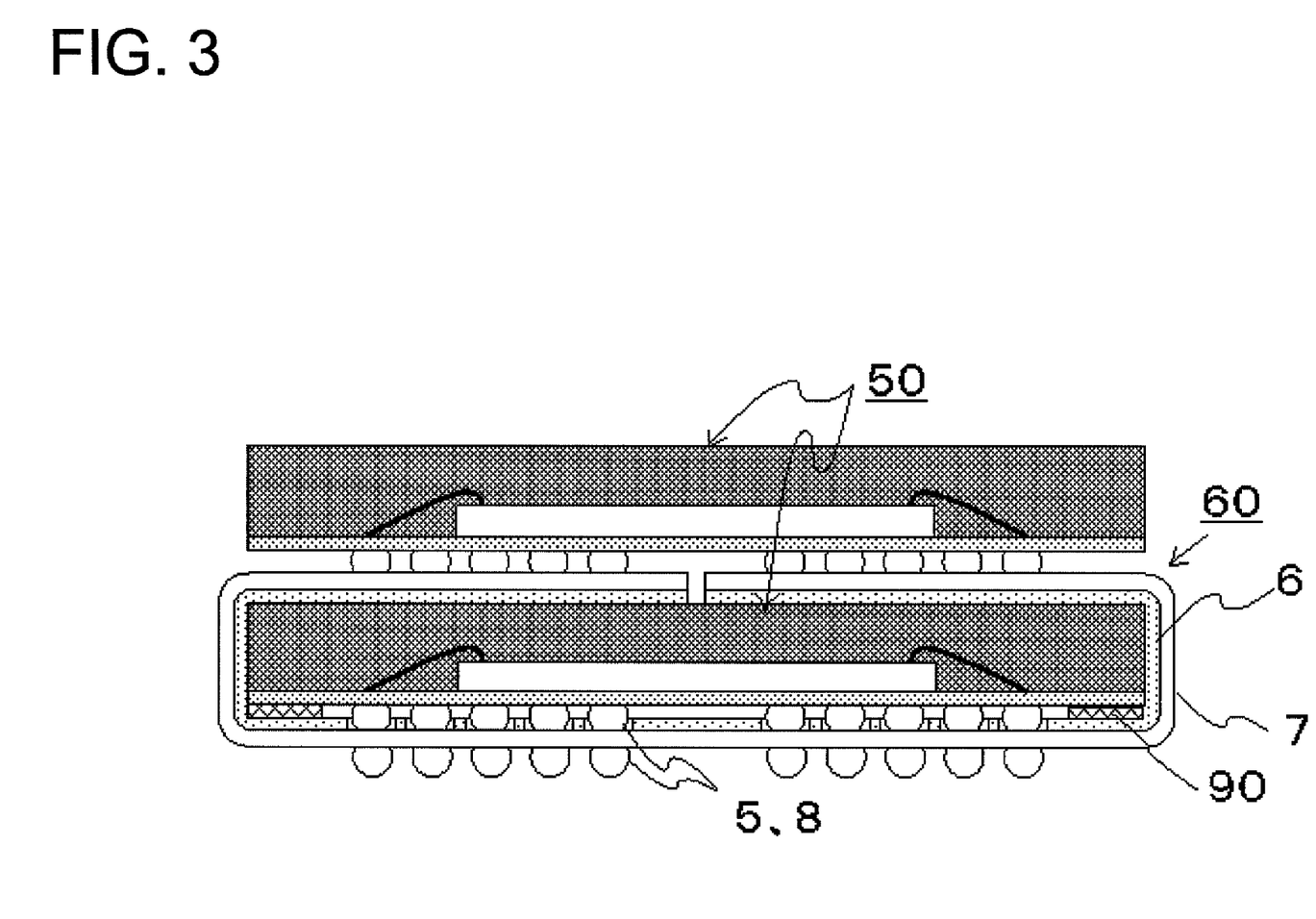
FIG. 3 shows a schematic sectional view of a mounting structure according to a second exemplary embodiment of the present invention.

FIG. 3 shows a schematic sectional view of a package-stacked semiconductor device (mounting structure), in which a restructured semiconductor device (mounting structure 60) according to the present invention provided at the lower portion and a non-restructured semiconductor device 50 provided on the upper portion are stacked and connected each other by a solder reflow step. Although the semiconductor device 50 of the upper portion is the same as that of the lower portion in FIG. 3, it may be a different kind of product, different type of semiconductor device such as a wafer-level CSP, sensing device or passive component such as a capacitor, resistance or inductor.

Exemplary Embodiment 3

Figure 4:
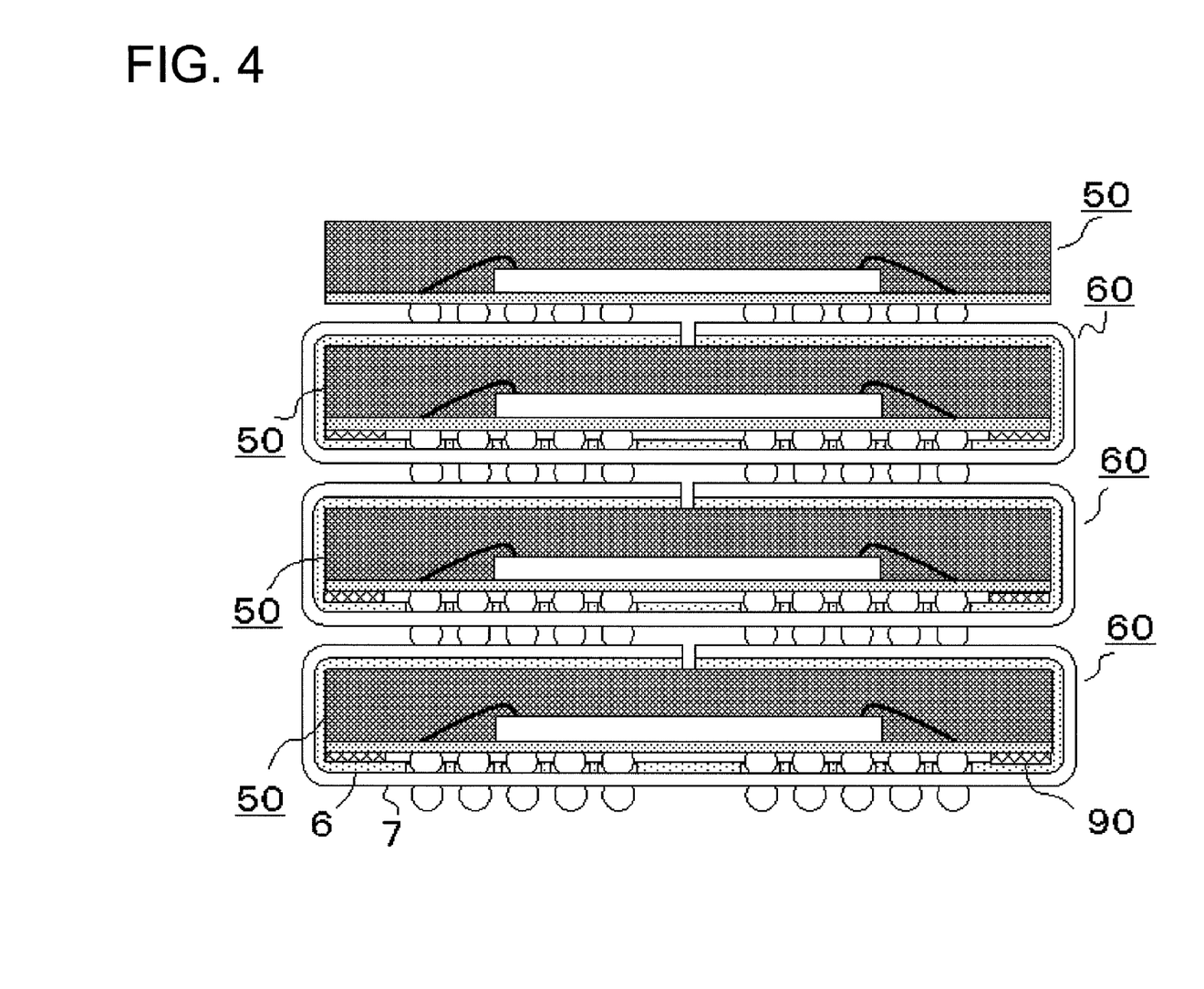
FIG. 4 shows a schematic sectional view of a mounting structure according to a third exemplary embodiment of the present invention.

FIG. 4 shows an exemplary embodiment, in which more packages are stacked on the structure shown in FIG. 3. Three stackable-restructured semiconductor devices (mounting structures 60) according to the present invention at the lower portion and a non-restructured semiconductor device 50 on the top of the three restructured devices are stacked in this structure. As for the three-stacked portion of the restructured semiconductor devices (mounting structures 60), it can be structured using the same or different kinds of semiconductor devices and the number of the layers cannot be necessarily three.

In addition all of the stacked semiconductor devices can be the restructured semiconductor devices (mounting structures 60) according to the present invention.

Another effect of the present structure is to promote a heat radiation from the semiconductor device 50 by using a material of high thermal conductivity for the supporting member 90. A metal material such as a cupper, aluminum or inorganic material such as stainless steel or carbon graphite, for example, may be preferably used for the supporting member 90 for this purpose. An adhesive (not shown) of high thermal conductivity is preferably used in such a case such as a conductive adhesive containing metal fillers, for example, to affix the supporting member 90. The adhesive is not necessarily made of curable materials but a gel-type heat radiation compound or grease, for example.

The corner of the supporting member 90 that corresponds to a position where the flexible wiring board 7 is bent is preferably chamfered in an arc shape or C-shape. The structure contributes to make it possible to reduce a curvature (i.e., enlarge radius of curvature) of the wiring on the flexible wiring board 7 and accordingly it reduces breakings of wiring due to mechanical bending as well as electric noise due to reflections of rapid signals in the wiring.

Exemplary Embodiment 4

Next, another exemplary embodiment of a mounting structure according to the present invention is explained in detail with reference to FIG. 5. A partial enlarged figure in FIG. 5 (depicted in a circle) is a schematic sectional view of an exemplary embodiment that the supporting member 90 and a ground pattern 11 formed on the flexible wiring board 7 of the mounting structure of FIG. 3 is electrically connected via a conductive bump 14. A wiring pattern 12 formed on the flexible wiring board 7, insulation layer 13 and cover resin 15 to cover the flexible wiring board 7, and wiring pattern 12 formed on the cover resin 15 are also shown in FIG. 4. A material for the supporting member 90 may be a conductive material such as an aluminum, cupper or stainless steel, for example.

By means of the structure, the wiring pattern 12 on the flexible wiring board 7 for transmitting signals can be formed as a microstrip line structure when rapid signal processing is carried out between a semiconductor product on the mounting structure and the semiconductor devices at the lower portion or other wiring substrate on which the mounting structures are mounted.

In general, it is impossible to make a microstrip line structure when the flexible wiring board 7 has only a single wiring layer. However, it becomes possible to make the microstrip line structure even when the flexible wiring board 7 has only one wiring layer by including a supporting member 90 of a material having conductivity and electrically connecting the supporting member 90 and the ground pattern 11 formed on the flexible wiring board 7.

Thus a package-stackable mounting structure having good electric characteristics for semiconductor products which require very rapid operation can be provided.

Figure 5:
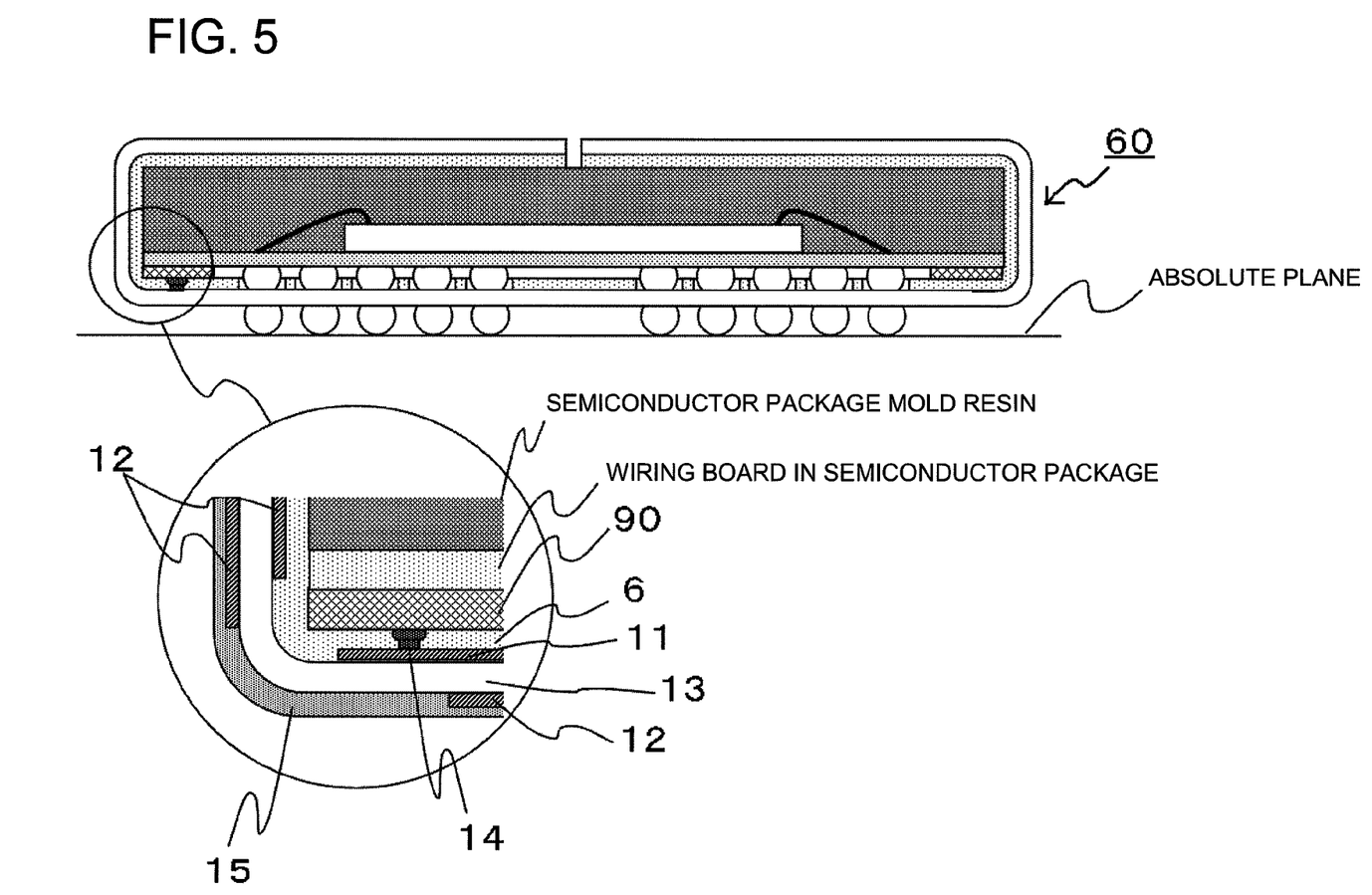
FIG. 5 shows a schematic (partial) sectional view of a mounting structure according to a fourth exemplary embodiment of the present invention.

Although the corner of the supporting member 90 is not chamfered in the partial enlarged portion of FIG. 5, the corner may be chamfered in an arc shape or C-shape.

Exemplary Embodiment 5

Further exemplary embodiment of a mounting structure according to the present invention is explained in detail with reference to FIGS. 6A to 6E.

The support element 90 is provided only under the semiconductor device 50 in exemplary embodiment 1. However, the setting position of the supporting member 90 should be precisely determined so as to arrange the electrodes precisely when the electrodes are set on the semiconductor device 50 by folding the semiconductor device 50 in the flexible wiring board 7 and adhere to each other. Therefore a rising portion 91 standing up along the side face of the semiconductor device 50 is formed from an outer edge of the supporting member 90 and the supporting member 90 is affixed to both the side face and the lower surface of the semiconductor device 50 in exemplary embodiment 5. Owing to the structure, the position of the electrodes on the upper surface of the semiconductor device 50 can be determined more precisely by contacting with the semiconductor device 50.

Figure 6A:
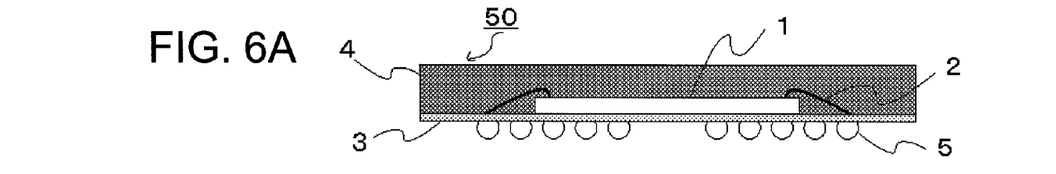
FIGS. 6A to 6E show schematic sectional views of a mounting structure according to a fifth exemplary embodiment of the present invention.

FIG. 6A is a sectional view of a standard CSP package (semiconductor device) 50 having solder bumps 5 as outer terminals which are suitable for high density mounting.

FIGS. 6B to 6E illustrate schematic sectional views and manufacturing steps of a package-stackable mounting structure of the semiconductor device 50. The standard packaged-type semiconductor device 50 having the solder bumps 5 as outer terminals is restructured by being folded in a flexible wiring board 7 having a wiring pattern to electrically connect lower electrodes and upper electrodes of the semiconductor device 50 and thus it becomes possible to stack the package-stackable semiconductors in three dimensions.

Figures 6B, 6C:
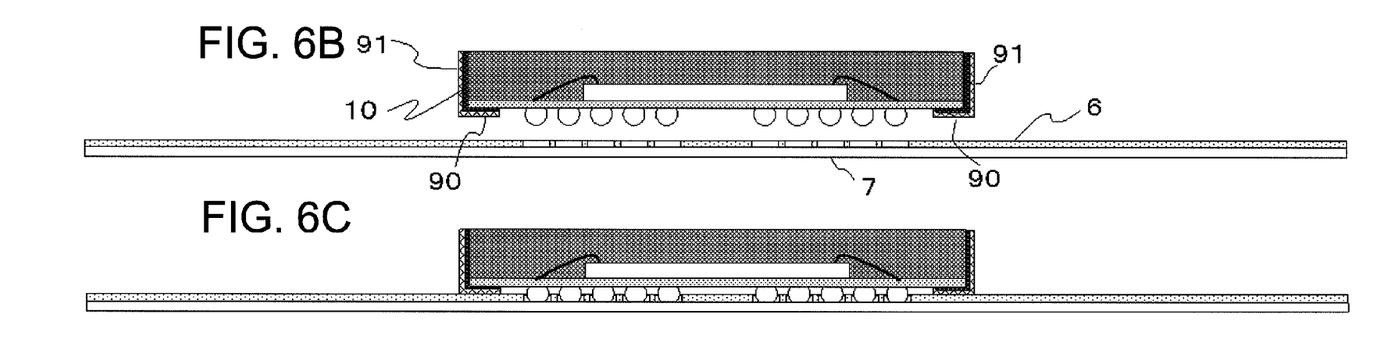

FIG. 6B shows a sectional view in which the supporting members 90 having the rising portion 91 are affixed to the side faces and a part of the lower surface of the semiconductor device 50 by an adhesive 10. The supporting members 90 are hit against the side face and the lower surface of the semiconductor device 50 and affixed to it. According to the figures the supporting members 90 are adhered by the adhesive 10 to both of the lower surface and the side faces of the semiconductor device 50. However, either lower surface or side faces may be enough to adhere by the adhesive 10. The adhesive can be various kinds of type such as a film type or a liquid type.

The support element 90 may be provided along the peripheral area of the lower surface (on which outer terminals are formed) of the semiconductor device 50 or a part of a corner or side portion of the semiconductor device 50.

FIG. 6C is a mounted state of the semiconductor device 50 shown in FIG. 6B on the flexible wiring board 7 using a reflow method. The heights of the solder bumps 5 become small due to the molten-connection too the electrodes of the flexible wiring board 7 and the bottom surface of the supporting member 90 is in contact with a surface of a thermoplastic resin 6 on the flexible wiring board 7. The thickness of the supporting member 90 corresponds to a height of the solder ball (in the case without an adhesive layer) or subtracted by a thickness of the adhesive layer (thermoplastic resin 6, in the case of existing the adhesive layer) when the solder ball is attached on the flexible wiring board 7 by a reflow method without the supporting member 90, and preferably the lower surface of the supporting member 90 contacts with the surface of the flexible wiring board 7 or the thermoplastic resin 6. More preferably, the thickness of the supporting member 90 is slightly larger to assure the contact with the thermoplastic resin 6.

Figures 6D, 6E:
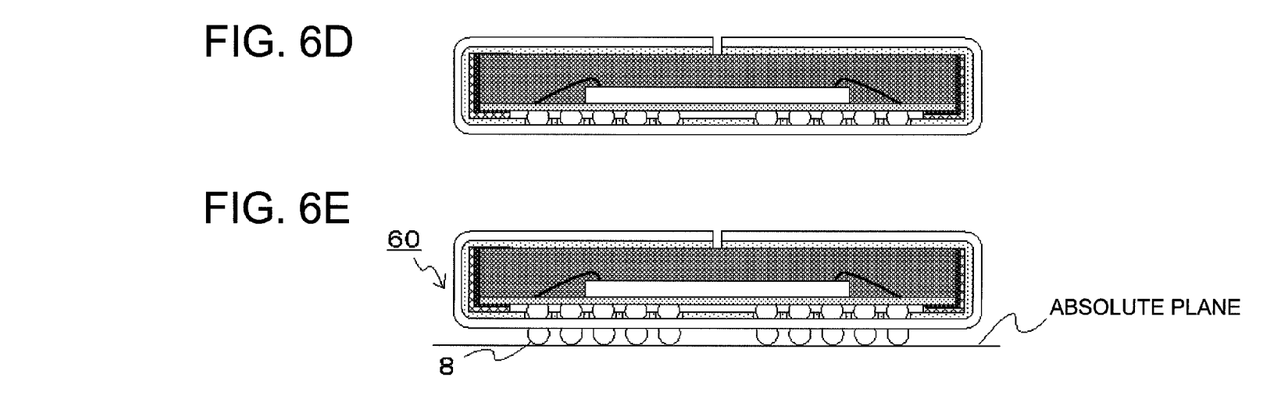

FIG. 6D is a sectional view of a mounting structure 60 whose flexible wiring board 7 is folded and adhered so as to cover the whole supporting members 90 having the rising portion 91 from the state shown in FIG. 6C. The supporting members 90 can be closely contacted with the semiconductor device 50 by hitting against both the lower surface and the side faces of the semiconductor device 50 and an increasing of a size due to an addition of the supporting members 90 may be minimized. In addition an outer shape of the mounting structure 60 with the supporting members 90 can be determined accurately due to the contacted structure. Therefore a length of the flexible wiring board 7 to fold (wrap) the semiconductor device 50 can be made uniform and a dispersion of the positions of electrodes formed on the flexible wiring board 7 of the upper portion of the mounting structure may be reduced.

Preferably at least a part of the rising portion 91 is adhered with the flexible wiring board 7 in this case also to reduce a slacking of the flexible wiring board 7 by the heat during a reflow step.

Various kinds of materials including inorganic materials and organic materials may be available for the supporting member 90. However, in the case that the supporting member 90 has a ring shape provided along the peripheral area of the semiconductor device 50, the supporting member 90 preferably has a thermal expansion coefficient similar to that of the semiconductor device 50, other wiring substrates on which the restructured semiconductor package (mounting structure) is mounted or the flexible wiring board 7. Such formation is preferred in order to keep a reliability of the connecting portions of the solder bumps 5 against expansion-contraction cycles due to environmental temperature changes after mounting.

A glass-epoxy as an organic material or an aluminum, cupper or stainless steel as an inorganic material may be preferably used for the supporting member 90 because all of the thermal expansion coefficients of those materials are in the range from 10 ppm/degree C. to 30 ppm/degree C. More preferably the material of the supporting member 90 has a smaller thermal expansion coefficient than that of the flexible wiring board 7. The reason is that the lateral tension of the flexible wiring board 7 remaining after the structure is cooled below the reflow temperature because a contraction rate of the flexible wiring board 7 is larger than that of the supporting member 90 and thus the flexible wiring board 7 has a potency to be kept flat.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modification aforementioned.

What is claimed is:

1. A mounting structure comprising:
   at least one semiconductor device having solder bumps on a lower surface thereof as outer terminals and a flexible wiring board with wiring formed thereon, wherein;
   the semiconductor device is wrapped in the flexible wiring board,
   the mounting structure is provided with outer electrodes on both of a side on which the outer terminals of the semiconductor device are formed and an opposite side thereto,
   at least one wiring layer is formed on the flexible wiring board, and
   a supporting member is affixed between a lower surface of the semiconductor device on which the outer terminals are formed and the flexible wiring board,
   wherein the supporting member is provided with a rising portion standing up vertically between a side face of the semiconductor device and the flexible wiring board from at least a part of an outer edge of the supporting member.

2. The mounting structure according to claim 1, wherein at least a part of a surface of the semiconductor device opposite to the side on which the outer terminals are formed is adhered to the flexible wiring board.

3. The mounting structure according to claim 1, wherein at least a part of a side face of the semiconductor device is adhered to the flexible wiring board.

4. The mounting structure according to claim 1, wherein dimensions of outer shape of the supporting member are equal to or less than outer dimensions of the semiconductor device, and at least a portion in which the outer terminals of the semiconductor device are present is cut out to provide a through hole so as not to contact the outer terminals.

5. The mounting structure according to claim 1, wherein the supporting member is provided at least a part of a peripheral area of the surface of the semiconductor device the outer terminals are formed.

6. The mounting structure according to claim 1, wherein the supporting member has a thickness corresponding to a height of the solder bump when the solder bump is attached on the flexible wiring board by a reflow method without the supporting member in a case of using no adhesive layer, or in a case of existing the adhesive layer, a height obtained by subtracting by a thickness of an adhesive layer from the solder bump height, or larger than this height.

7. The mounting structure according to claim 1, wherein both of at least a part of the side face of the semiconductor device and at least a part of the lower surface of the semiconductor device are fixed in contact with the supporting member.

8. The mounting structure according to claim 1, wherein both of at least a part of the side face of the semiconductor device and at least a part of the lower surface of the semiconductor device are adhered to the supporting member via an adhesive material.

9. The mounting structure according to claim 1, wherein at least a part of the rising portion of the supporting member is adhered to the flexible wiring board.

10. The mounting structure according to claim 1, wherein a thermal expansion coefficient of the supporting member is the same or less than that of the flexible wiring board.

11. The mounting structure according to claim 1, wherein the supporting member is adhered by an adhesive to at least one of the flexible wiring board and the semiconductor device.

12. The mounting structure according to claim 11, wherein the adhesive comprises a conductive adhesive.

13. The mounting structure according to claim 1, wherein the supporting member is formed by a conducive material and the supporting member and a ground pattern formed on the flexible wiring board are electrically connected via a conductive bump.

14. The mounting structure according to claim 1, wherein an outermost corner portion of the supporting member corresponding to a position at which the flexible wiring board is bent is chamfered in an arc shape or C-shape.

15. The mounting structure according to claim 1, wherein at least one adhesive layer is formed on a surface of the flexible wiring board, the semiconductor device and at least a part of the flexible wiring board being adhered each other by the adhesive layer.

16. The mounting structure according to claim 15, wherein the adhesive layer comprises a thermoplastic resin or a pre-setting thermosetting resin.

17. A stacked-type semiconductor device comprising the mounting structure according to claim 1.

18. The stacked-type semiconductor device according to claim 17, wherein a passive component is further mounted.

19. An electronic apparatus comprising the stacked-type semiconductor device according to claim 17.

* * * * *

UNITED STATES PATENT AND TRADEMARK OFFICE
CERTIFICATE OF CORRECTION

| | |
|---|---|
| PATENT NO. | : 8,130,503 B2 |
| APPLICATION NO. | : 12/411884 |
| DATED | : March 6, 2012 |
| INVENTOR(S) | : Shinji Watanabe and Takao Yamazaki |

It is certified that error appears in the above-identified patent and that said Letters Patent is hereby corrected as shown below:

In the Claims

Column 12, Line 26: In Claim 13, delete "conducive" and insert -- conductive --

Signed and Sealed this
Twenty-third Day of September, 2014

Michelle K. Lee
*Deputy Director of the United States Patent and Trademark Office*